(12) United States Patent
Iwamoto et al.

(10) Patent No.: US 7,252,778 B2
(45) Date of Patent: Aug. 7, 2007

(54) ETCHING METHOD AND ETCHING DEVICE

(75) Inventors: Hayato Iwamoto, Kanagawa (JP); Kei Kinoshita, Villach (AT); Hajime Ugajin, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/839,404

(22) Filed: May 5, 2004

(65) Prior Publication Data

US 2005/0000940 A1 Jan. 6, 2005

(30) Foreign Application Priority Data

May 12, 2003 (JP) .......................... P2003-132764

(51) Int. Cl.
*B44C 1/22* (2006.01)
(52) U.S. Cl. ......................................... 216/84; 216/92
(58) Field of Classification Search ................... None
See application file for complete search history.

(56) References Cited

U.S. PATENT DOCUMENTS

| | | | |
|---|---|---|---|
| 5,897,379 A * | 4/1999 | Ulrich et al. ............... 438/754 |
| 6,096,233 A * | 8/2000 | Taniyama et al. ............. 216/92 |
| 6,203,218 B1 * | 3/2001 | Omori et al. ................ 396/611 |
| 6,817,790 B2 * | 11/2004 | Toshima et al. ............. 396/604 |
| 6,932,884 B2 * | 8/2005 | Saito et al. ............. 156/345.17 |
| 6,983,755 B2 * | 1/2006 | Nam et al. ................... 134/147 |
| 2003/0180127 A1 * | 9/2003 | Kuroda ........................ 414/217 |
| 2004/0060906 A1 * | 4/2004 | Bachrach et al. ............. 216/92 |
| 2004/0084144 A1 * | 5/2004 | Yokouchi et al. ....... 156/345.11 |

\* cited by examiner

*Primary Examiner*—Anita Alanko
(74) *Attorney, Agent, or Firm*—Sonnenschein Nath & Rosenthal LLP

(57) ABSTRACT

An etching method and etching device are provided, enabling uniform rendering of the thickness of a film for processing on a wafer regardless of the film thickness profile thereof, and thereby enabling global planarizing of the wafer surface. In an etching method, the film thickness profile of the film for processing formed on the wafer is ascertained in advance, and wet etching is performed by discharging an etchant liquid L1 at a thick portion of the film for processing; simultaneously with the discharge of the etchant liquid L1, a diluting liquid L2 for the etchant liquid L1 is discharged at a thin portion of the film for processing.

4 Claims, 11 Drawing Sheets

Position in Radial Direction of Wafer [mm]

Position in Radial Direction of Wafer [mm]

Wafer Center Portion  Wafer Periphery Portion

Position in Radial Direction of Wafer [mm]

Position in Radial Direction of Wafer [mm]

Wafer Center Portion        Wafer Periphery Portion

ETCHING METHOD AND ETCHING DEVICE

RELATED APPLICATION DATA

The present application claims priority to Japanese Application(s) No(s). P2003-132764 filed May 12, 2003, which application(s) is/are incorporated herein by reference to the extent permitted by law.

BACKGROUND OF THE INVENTION

1. Field of the Invention

This invention relates to an etching method to planarize the surface shape of a wafer, and an etching device employing this method.

2. Description of the Related Art

The rising integration levels in semiconductor devices in recent years have been accompanied by advances in the miniaturization and multilayer design of elements and wiring. Pattern formation for fine wiring may also rely on thin film fabrication techniques and lithography, but with the adoption of multilayer designs, a planarized base surface is indispensable for the precise formation of fine patterns.

For example, in reducing the size of a gate electrode, much depends on the performance of the exposure equipment used in lithography processes; however where miniaturization of device isolation regions and reduction of distances from other gate electrodes are concerned, techniques to planarize the base surface using shallow trench isolation (hereafter abbreviated "STI") are also attracting attention in addition to advanced lithographic techniques.

FIGS. 1A to 1C shows cross-sectional process diagrams of STI processes, as one example of a planarizing process. As shown in FIG. 1A, in an STI process, first a stopper layer 3 made of silicon nitride is patterned via a thermal oxide film 2 on the wafer 1 which is the silicon substrate, and this stopper layer 3 is used as an inorganic mask to form trenches 4 on the surface side of the wafer 1. Then, a buried insulating film 5 of silicon oxide is deposited so as to bury these trenches 4. Here, the buried insulating film 5 is formed by ordinary CVD; however when using CVD for film deposition, dispersion occurs in the deposited film thickness at the surface of the wafer 1, so that an insulating film is formed in which, compared for example with the thickness $t_1$ at the center of the wafer 1, the film thickness $t_2$ at the periphery is larger.

In this state, if CMP (chemical-mechanical polishing) is performed to planarize the buried insulating film 5, a global step existing at the surface of the initial buried insulating film 5 remains at the surface of the buried insulating film 5 even after polishing.

Hence as shown in FIG. 1B, as preprocessing for planarizing by CMP, etching is performed in order to render the thickness of the buried insulating film 5 uniform. In this etching, the film thickness profile of the buried insulating film 5 which is the film to be etched is ascertained in advance, and etchant liquid is discharged only at thick portions of the buried insulating film 5 to etch the buried insulating film 5. In this case, as for example shown in FIG. 2, the discharge position of the etchant liquid L1 is caused to move in the radial direction of the rotating wafer 1. At this time, the discharge position of the etchant liquid L1 is moved such that the etchant liquid L1 is supplied in greater total quantities to portions of the film that are thick, based on the film thickness profile information in the radial direction of the wafer 1 for the film to be etched (the buried insulating film 5), as shown by the film thickness profile of FIG. 3A.

Accordingly, buried insulating film the thickness of which is greater at the periphery of the silicon substrate than at the center (0) becomes such that the film thickness at the periphery and near the center (0) is the same, as shown by the profile of FIG. 3B, so that a globally planarized buried insulating film on the silicon substrate is obtained (see Japanese Patent Laid-open No. 2002-134466).

Further, in STI formation, when by the above-described etching the thickness of the buried insulating film 5 is rendered uniform as shown in FIG. 1B, CMP of the surface of the buried insulating film 5 is performed until the stopper layer 3 is exposed, as shown in FIG. 1C. Accordingly, excessive polishing at the center of the wafer 1 can be prevented without leaving buried insulating film 5 on the stopper layer 3 at the periphery of the wafer 1.

However, when using the above-described etching method, the film thickness profiles of the film for processing which can be corrected are limited; for example, the film thickness of a film for processing with a large film thickness near the center (0) of the wafer, as shown in FIG. 4A, cannot be rendered uniform. That is, if a film for processing having such a film thickness profile is subjected to correction of film thickness using the above-described etching method, the discharge position of the etchant liquid 1 is positioned near the center (0) of the wafer, where the film thickness is greatest, so that the etchant liquid L1 flows toward the wafer periphery due to centrifugal force and is supplied to the entire surface of the wafer. Hence even if such an etching method is used, the entirety of the film for processing is merely etched to become a thin film, as shown in FIG. 4B, and the film thickness cannot be rendered uniform.

In the STI formation process, planarizing by CMP is performed on the buried insulating film (film for processing) subjected to such etching. Consequently, as shown in FIG. 5A, if the CMP conditions are set so as to expose the stopper layer 3 at the wafer periphery, the buried insulating film 5 on the stopper layer 3 at the center of the wafer remains in place and is not polished. If this state is retained in the next process, and an attempt is made to remove the stopper layer 3 by wet etching using hot phosphoric acid or by isotropic chemical dry etching, the remaining buried insulating film 5 at the wafer periphery acts as a mask, and complete removal is not possible. As a result, the desired etched shape is not obtained at the wafer periphery, leading to unsatisfactory semiconductor device characteristics and drops in production yield.

Further, if in order to avoid the above adverse effects CMP polishing is performed so as to expose the stopper layer 3 at the center of the wafer as shown in FIG. 5B, the buried insulating film 5 in the trenches 4 is polished excessively at the wafer periphery, so that the thickness of the buried insulating film 5 in the trenches 4 is different at the wafer center and at the periphery. As a result, the element isolation characteristics are different across the wafer surface. Hence the desired semiconductor device characteristics are not obtained, and drops in production yield result.

In light of the above, this invention has as an object of providing an etching method and etching device, in which the film thickness of a film to be processed having any film thickness profile can be uniform, regardless of the film thickness profile of the film to be processed on the wafer, and global planarizing of the wafer surface can be obtained.

SUMMARY OF THE INVENTION

In order to attain this object, an etching method of this invention is the etching method in which the film thickness profile of a film for processing formed on a wafer is ascertained in advance and an etchant liquid is discharged onto thick portions of the film for processing to perform wet etching, and simultaneously with the discharge of etchant liquid, a diluting liquid for the etchant liquid is discharged onto thin portions of the film for processing.

By means of this etching method, if the etchant liquid discharged onto thick portions of the film for processing spreads to thin portions of the film for processing, the etchant liquid is diluted by the diluting liquid discharged at the thin portions. Accordingly, the effect of etching of the film for processing by the etchant liquid is weakened at thin portions. Hence etching of the film for processing proceeds further at thick portions of the film than at thin portions, and the film thickness distribution of the film for processing can be rendered uniform.

Further, an etching device of this invention includes a spin chuck which holds and rotate a wafer, a liquid-discharging nozzle to supply etchant liquid to a predetermined position on the wafer held by the spin chuck, and a diluting liquid-discharging nozzle to discharge a diluting liquid for the etchant liquid on the outside of the position where etchant liquid is discharged on the wafer held by the spin chuck.

In an etching device of this configuration, etchant liquid is discharged from a liquid-discharging nozzle at a predetermined position in the radial direction of a wafer held and rotated on the spin chuck, and a diluting liquid is discharged from the diluting liquid-discharging nozzle on the outside of this predetermined position. Hence although the etchant liquid flows and is supplied on the outside of the position where etchant liquid is discharged due to centrifugal force resulting from the wafer rotation, the etchant liquid is diluted by the diluting liquid, and the rate of etching can be reduced. On the other hand, on the inside of the position where etchant liquid is discharged, the centrifugal force due to wafer rotation prevents the flowing-in of etchant liquid, so that etching by the etchant liquid can be suppressed. Consequently the etching rate can be made highest at the position where etchant liquid is discharged, and etching progress can be suppressed in the outer and inner radial directions from this discharge position.

DESCRIPTION OF THE PREFERRED EMBODIMENTS

Figure 1A:
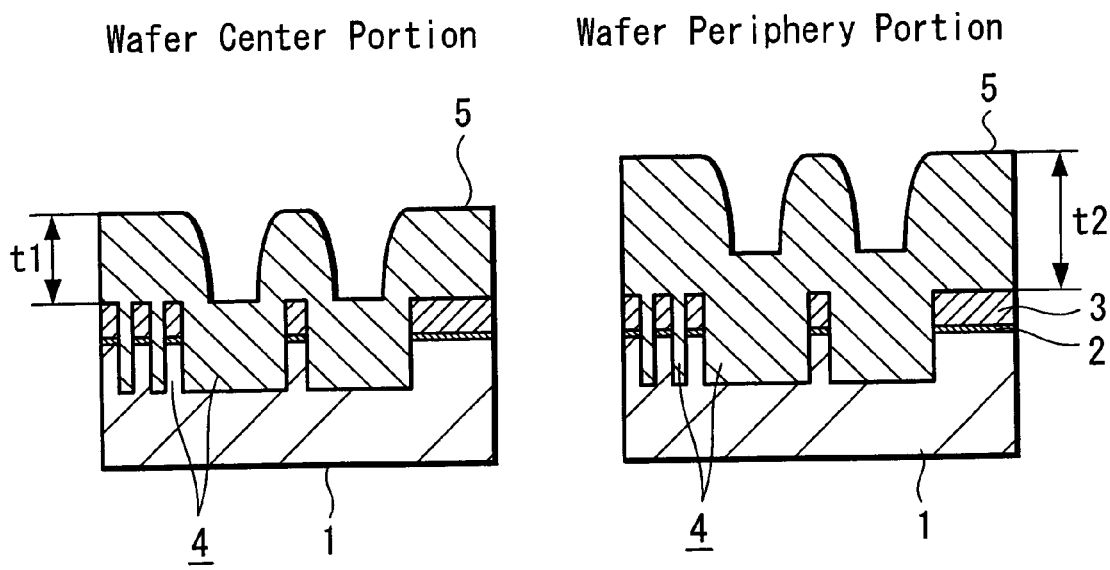
FIGS. 1A to 1C are cross-sectional process diagrams of an STI process to explain an example of the related art.
Figure 1B:
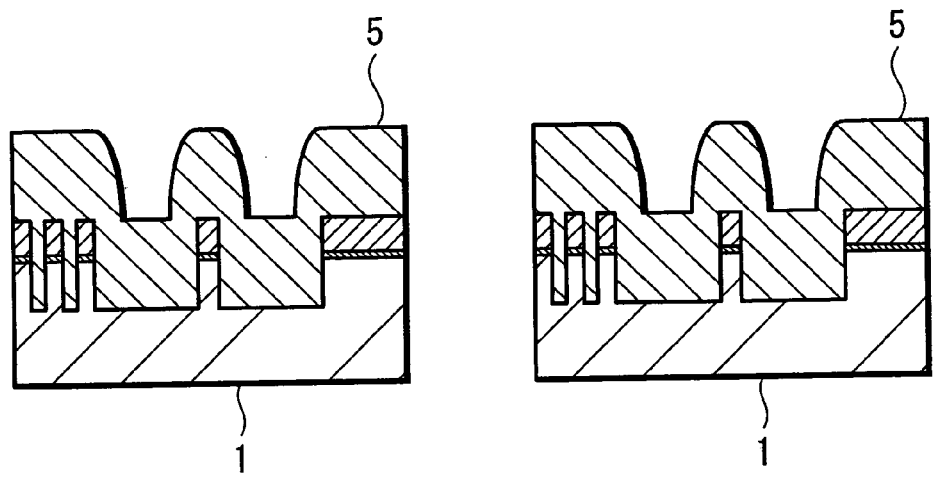
Figure 1C:
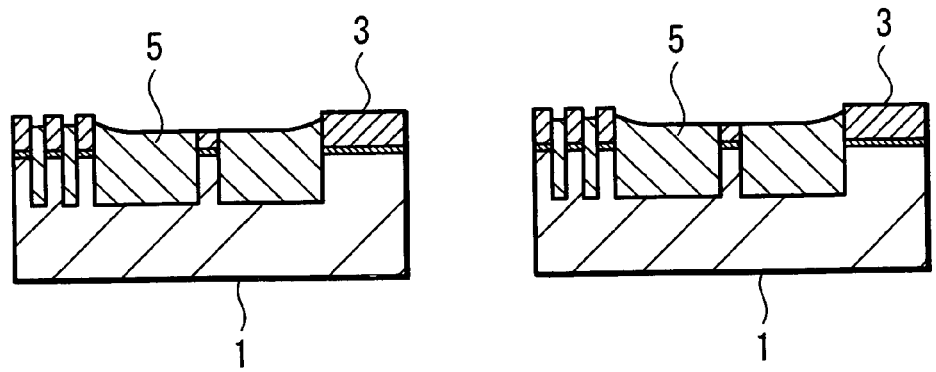
Figure 2:
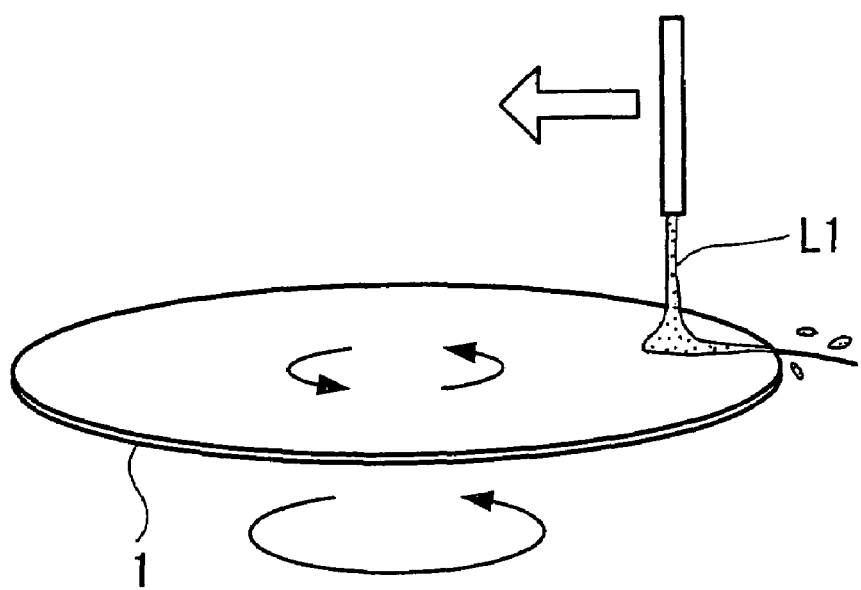
FIG. 2 is a diagram for explaining an etching method of the related art.
Figure 3A:
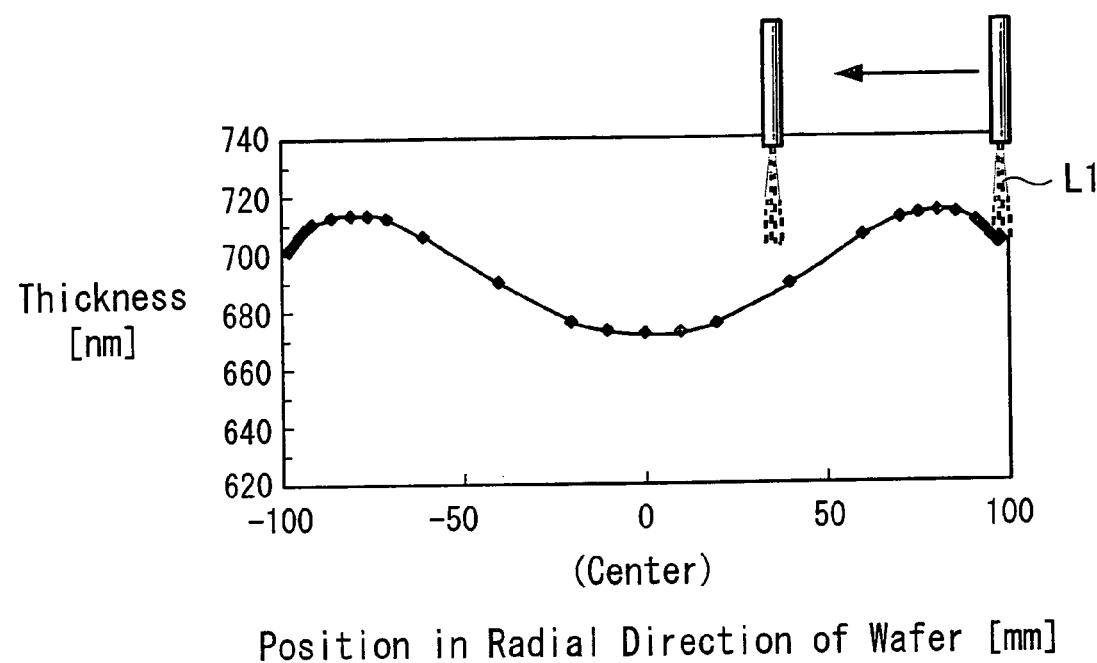
FIGS. 3A and 3B are film thickness profiles of a film for processing to explain an etching method of the related art.
Figure 3B:
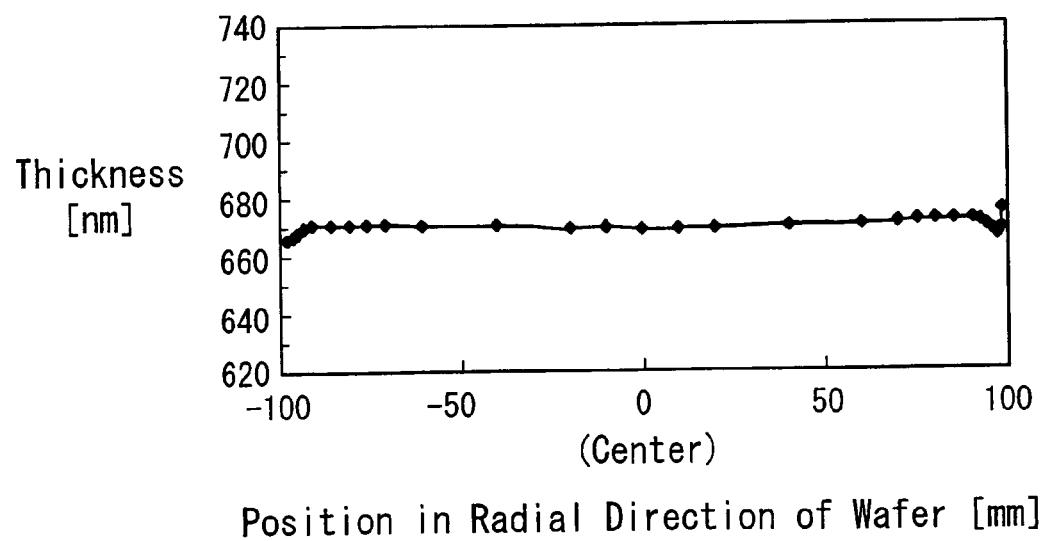
Figure 4A:
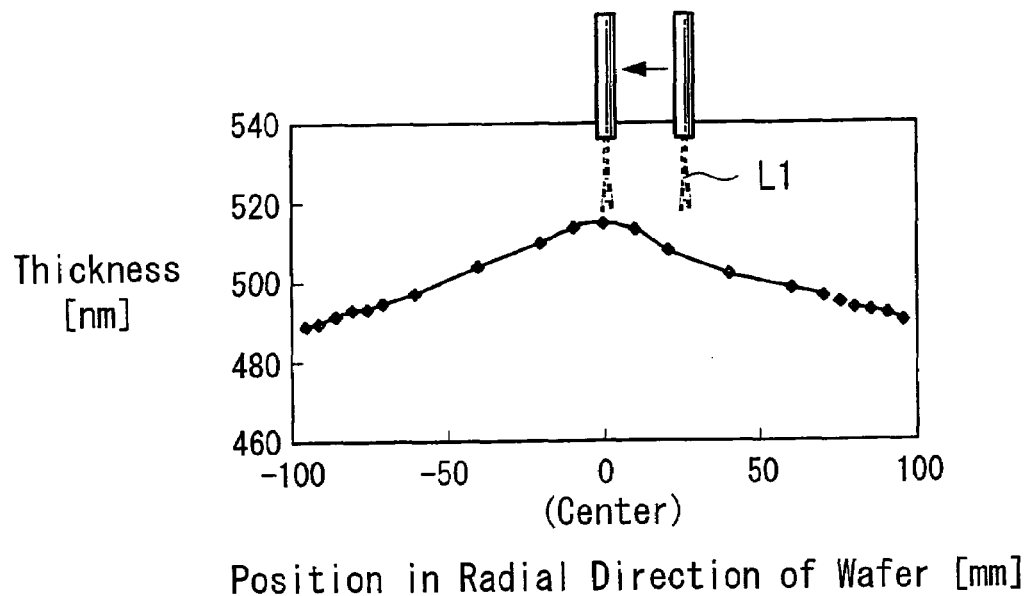
FIGS. 4A and 4B are film thickness profiles of a film for processing to explain problems with an etching method of the related art.
Figure 4B:
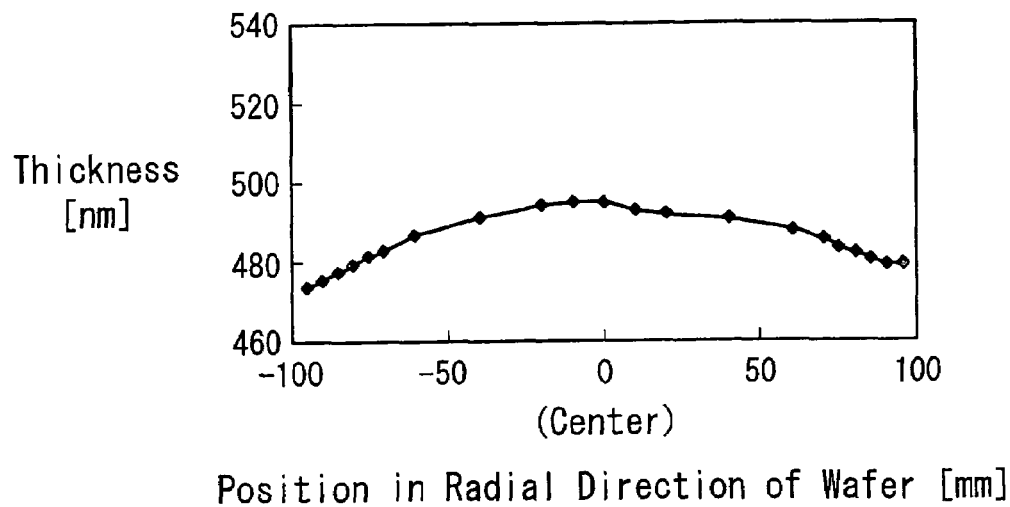
Figure 5A:
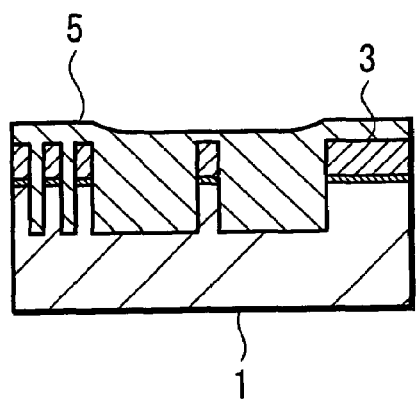
FIGS. 5A and 5B are cross-sectional views to explain problems with STI formation employed in conventional etching methods.
Figure 5A:
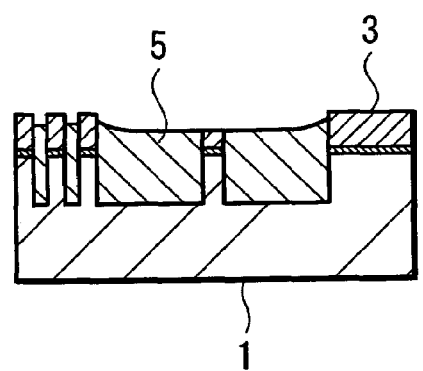
Figure 5B:
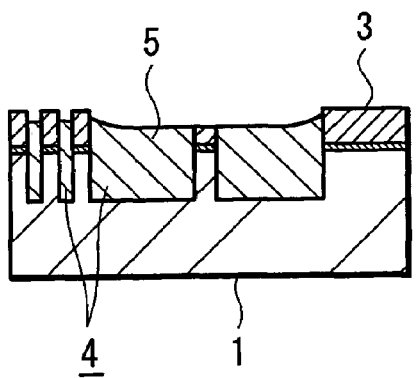
Figure 5B:
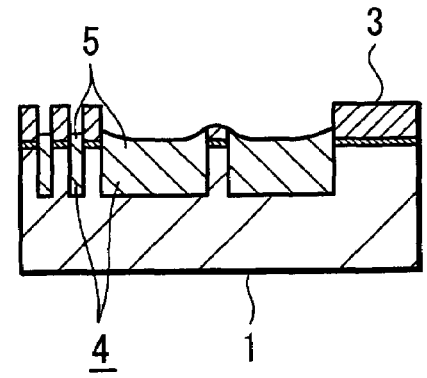

Hereinafter, embodiments of etching methods and etching devices to which this invention are applied are explained in detail, referring to the drawings.

[Etching Device]

Figure 6:
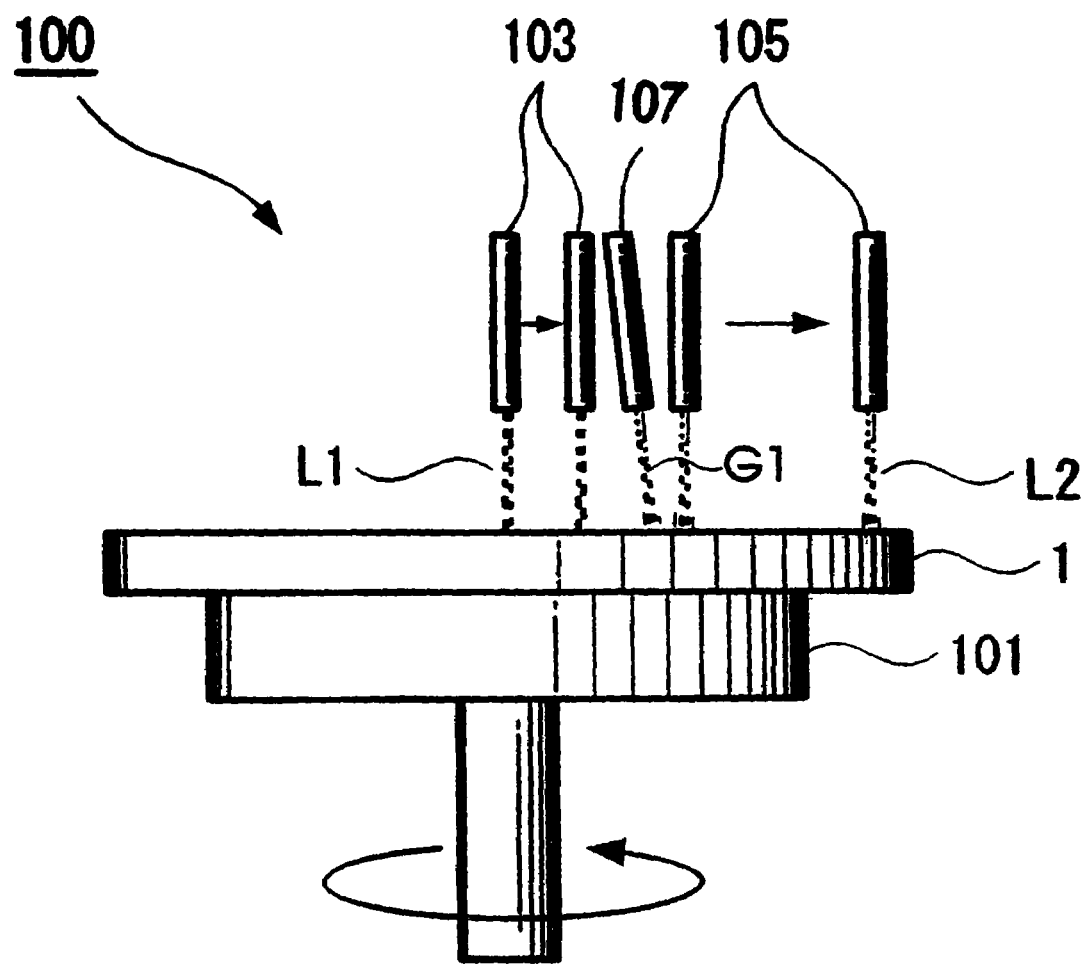
FIG. 6 is a diagram showing the configuration of one example of an etching device using an etching method of this invention.

FIG. 6 shows the configuration of one example of an etching device using an etching method of this invention. An etching device 100 shown in this figure includes: a spin chuck 101 which holds and rotates a wafer 1, a liquid-discharging nozzle 103 which discharges etchant liquid L1, and a diluting liquid-discharging nozzle 105 which discharges diluting liquid L2.

Of these, the liquid-discharging nozzle 103 in particular discharges etchant liquid L1 at a predetermined position on a wafer held by the spin chuck 101. This liquid-discharging nozzle 103 is freely moveable in the radial direction from the center of rotation of the wafer 1 held by the spin chuck 101, in a configuration enabling movement of the position of discharging the etchant liquid L1. The liquid-discharging nozzle 103 may have a plurality of discharge apertures to discharge the etchant liquid L1 at a plurality of positions in the radial direction on the wafer 1 held by the spin chuck 101.

The diluting liquid-discharging nozzle 105 discharges diluting liquid L2 for the etchant liquid L1, at a predetermined position on the wafer 1 held by the spin chuck 101. This diluting liquid-discharging nozzle 105 is provided so as to discharge diluting liquid L2 on the outside from the position where etchant liquid L1 is discharged by the liquid-discharging nozzle 103, with respect to the rotation center of the spin chuck 101. Further, the diluting liquid-discharging nozzle 105 is freely moveable in the radial direction on the wafer 1 held by the spin chuck 101, in a configuration enabling movement of the position where the diluting liquid L2 is discharged. Note that the diluting liquid-discharging nozzle 105 may have a plurality of discharge apertures to discharge the diluting liquid L2 at a plurality of positions in the radial direction on the wafer 1 held by the spin chuck 101.

In the etching device 100 with such a configuration, etchant liquid L1 is discharged from the liquid-discharging nozzle 103 at a predetermined position in the radial direction of the wafer 1 held and rotated on the spin chuck 101, and diluting liquid L2 is discharged from the diluting liquid-discharging nozzle 105 on the outside from this predetermined position. Accordingly, although the etchant liquid L1 flows and is supplied to the outside of the position where the etchant liquid L1 is discharged through the centrifugal force due to the rotation of the wafer 1, the etchant liquid L1 is diluted by the diluting liquid L2, so that the etching rate can be lowered. On the other hand, on the inside of the position where the etchant liquid L1 is discharged, inflow of the etchant liquid L1 is prevented by the centrifugal force due to the rotation of the wafer 1, so that progress of etching by the etchant liquid L1 can be suppressed. Hence etching can be performed such that the etching effect is greatest at the position where the etchant liquid L1 is discharged, and the etching effect is suppressed on the outside and inside thereof.

Since the liquid-discharging nozzle 103 is moveable in the radial direction, by moving the position of discharge of etchant liquid L1 in the radial direction together with supply of the etchant liquid L1 from the liquid-discharging nozzle 103, the amount of etchant liquid L1 supplied can be increased at positions further toward the outside. Accordingly, the effect of etching by the etchant liquid L1 can be increased to the extent that the position of discharge of the etchant liquid L1 is toward the outside. This is similarly the case even when the liquid-discharging nozzle 103 has a plurality of discharge apertures in the radial direction of the wafer 1, with etchant liquid L1 discharged from each discharge aperture.

Further, since the diluting liquid-discharging nozzle 105 is moveable in the radial direction, by moving the position of discharge of diluting liquid L2 in the radial direction together with the supply of diluting liquid L2 from the diluting liquid-discharging nozzle 105, the amount of diluting liquid L2 supplied can be increased at positions further toward the outside. Hence to the extent that the position of discharge of the diluting liquid L2 is toward the outside, the rate of dilution of the etchant liquid L1 can be increased, and the etching rate can be lowered. This is similarly the case even when the diluting liquid-discharging nozzle 105 has a plurality of discharge apertures in the radial direction of the wafer 1, with diluting liquid L2 discharged from each discharge aperture.

[Etching Method]

Next, an embodiment of an etching method of this invention employing an etching device with the above configuration is explained, based on the above FIG. 6 and various film thickness profiles.

As the basic concept underlying an etching method of this invention, the film thickness profile of the film for processing is ascertained in advance, etchant liquid L1 is discharged only onto portions with poor compatibility with the processing means, such as for example portions in which the film thickness is larger, and diluting liquid L2 is discharged onto portions where the film thickness is small to perform etching. An etching device with the configuration explained in FIG. 6 is suitable for use in the above etching.

In order to perform etching only at the thick portions of the above film, etchant liquid L1 is discharged at a position where the thickness of the film for processing is large in the radial direction of the wafer 1, based on position information in the radial direction for the wafer 1 and film thickness profile information about the film for processing formed on the wafer 1, and simultaneously with this, diluting liquid L2 for the etchant liquid L1 is discharged at a thin portion of the film on the outside of the position of discharge of the etchant liquid L1.

Figure 7A:
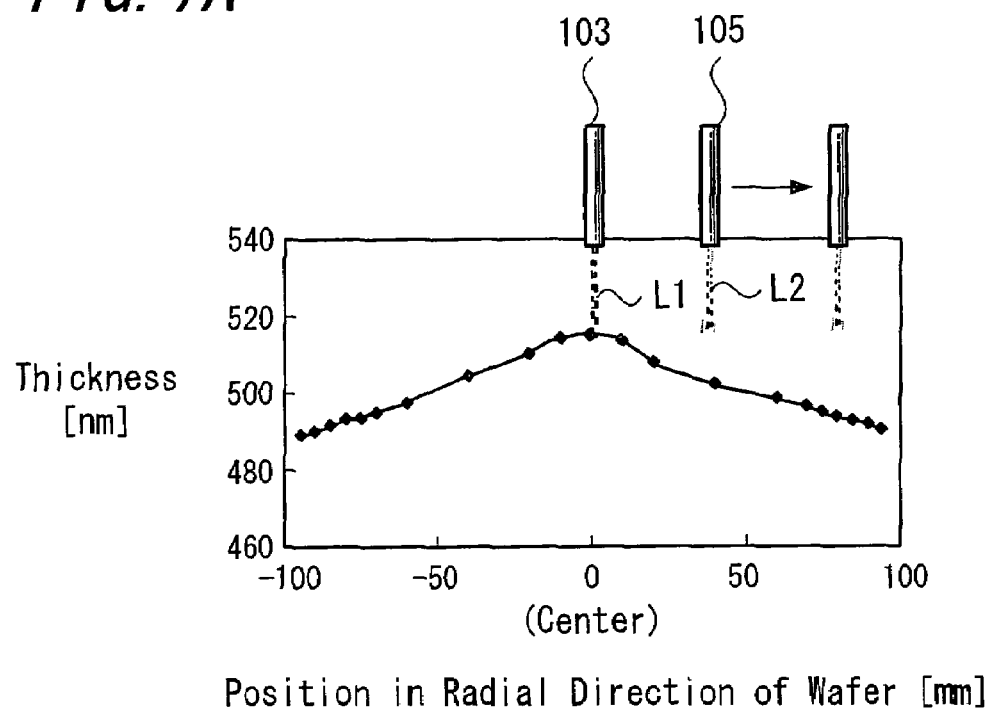
FIGS. 7A and 7B are film thickness profiles of a film for processing, showing a first example of an etching method of this invention.

First, as one example of the etching method, a case is illustrated in which a film for processing is formed on a wafer having a film thickness profile in which the film is thick in the center (0) portion and gradually becomes thinner toward the outer periphery, as shown FIG. 7A. Such dispersion in the thickness of a film for processing may arise from CVD film deposition, film deposition by coating and similar, or may be due to dispersion within the plane upon dry etching of the film for processing, but is assumed to be dispersion in film thickness in the radial direction of the wafer in particular.

In this case, first the wafer 1 is held and rotated by the spin chuck 101 in a state in which the rotation center of the spin chuck 101 is made to coincide with the center of the wafer. Then, by discharging etchant liquid L1 from the liquid-discharging nozzle 103 at the center (0) of the wafer, which is the portion where the thickness of the film for processing is greatest, the film for processing on the wafer 1 is etched.

Then, when etchant liquid L1 is discharged from the liquid-discharging nozzle 103 while rotating the wafer W, centrifugal force causes the etchant liquid L1 to flow in the outward radial direction, similarly to a so-called spin coater or other equipment. Accordingly, etching by the etchant liquid L1 occurs at the outer periphery of the wafer W as well.

Simultaneously with discharge of the etchant liquid L1 from the liquid-discharging nozzle 103, diluting liquid L2 for the etchant liquid L1 is discharged from the diluting liquid-discharging nozzle 105 at a position on the outside from the position where the etchant liquid L1 is discharged. As this diluting liquid L2, the solvent component of the etchant liquid L1, or else a chemical which neutralizes the etchant component in the etchant liquid L1, is used. As a result, the etchant liquid L1 is diluted (neutralized) by the diluting liquid L2 at the outer periphery, where the film for processing is thinner, compared with the center portion of the wafer W, so that the effect of etching of the film for processing by the etchant liquid L1 is weakened.

At this time, if the diluting liquid-discharging nozzle 105 discharges diluting liquid L2 while moving in the radial direction of the wafer 1 on the outside of the liquid-discharging nozzle 103, the time of supply of diluting liquid L2 is longer on moving to the outside. Therefore, the further toward the outside, the higher is the rate of dilution, and so the smaller is the effect of etching by the etchant liquid L1. If the diluting liquid-discharging nozzle 105 includes a plurality of discharge apertures in the radial direction, the amount of diluting liquid L2 supplied increases toward the outside, and toward the outside the rate of dilution of the etchant liquid L1 rises. Hence there is no need to cause the diluting liquid-discharging nozzle 105 to move in the radial direction of the wafer 1.

Figure 7B:
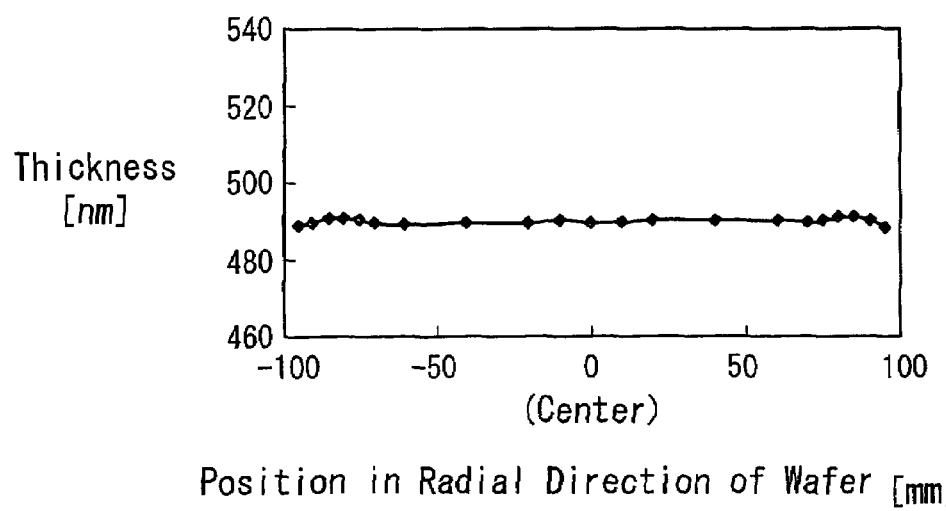

Accordingly, the difference in thickness of the film for processing at the center (0) of the wafer 1 and at the outside thereof can be alleviated, as shown in the film thickness profile in FIG. 7B. Further, the global difference in thickness over the surface of the film for processing can be alleviated. When a film for processing, the film thickness of which has been rendered uniform in this way, is subjected to CMP, etch-back or other planarizing processing, planarizing processing can be uniformly performed over the entire surface of the wafer 1.

Figure 8A:
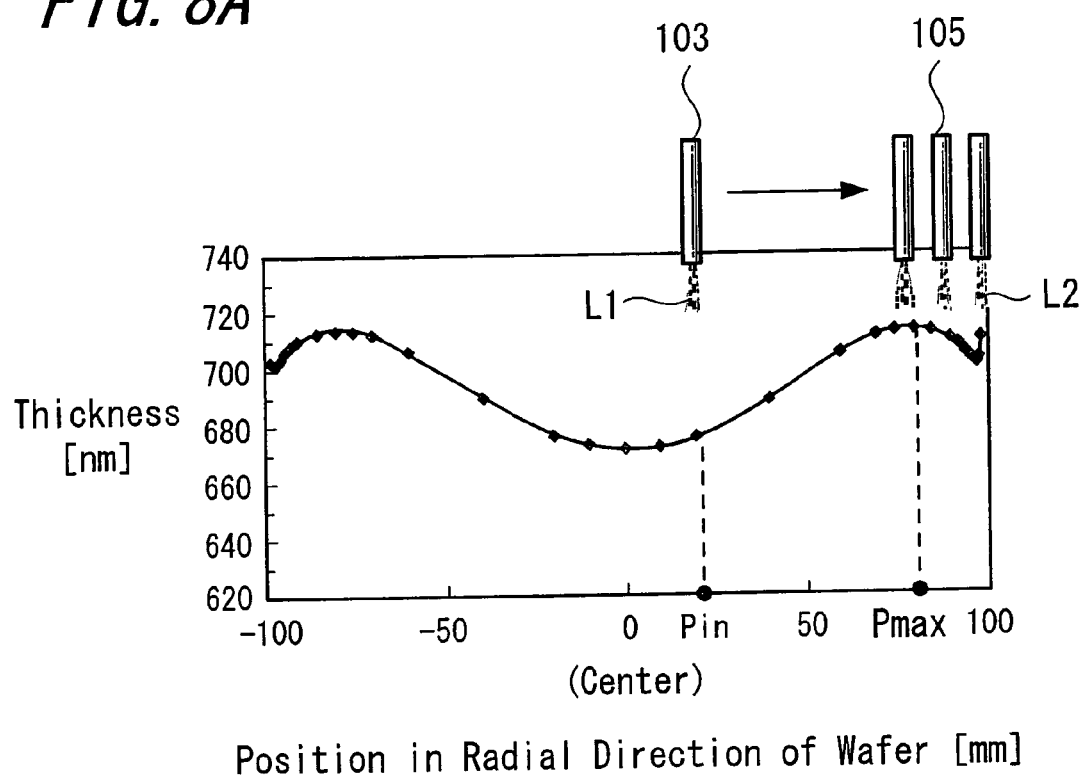
FIGS. 8A and 8B are film thickness profiles of a film for processing, showing a second example of an etching method of this invention.

Next, as a second example of an etching method, a case is illustrated in which a film for processing is formed having a film thickness profile in which the film is thin in the center (0) portion and gradually becomes thicker toward the outer periphery, as shown in FIG. 8A. Such dispersion in the thickness of a film for processing may arise similarly to the dispersion described in the first example.

In this case, first the wafer 1 is held and rotated by the spin chuck 101 in a state in which the rotation center of the spin chuck 101 is made to coincide with the center of the wafer. Then, etchant liquid L1 is discharged while moving the liquid-discharging nozzle 103 in the radial direction of the wafer W, from the position $P_{in}$ on the inside in the radial direction from the position $P_{max}$, at which the film is thickest, to this position $P_{max}$. Here the position $P_{in}$ is taken to be the position at which the film thickness changes from the smallest value to become thick. As a result, etchant liquid L1 is supplied from the position $P_{in}$ toward the outside through the action of centrifugal force, but the time of supply of etchant liquid L1 becomes longer in moving from the position $P_{in}$ toward the outside, and the time of supply of etchant liquid is longest at the outer periphery including the position $P_{max}$. Hence from the position $P_{in}$ to the position $P_{max}$, etching by etchant liquid L1 proceeds further in moving toward the outer periphery, so that the amount of etching of the film for processing increases.

When in this way etchant liquid L1 is discharged from the liquid-discharging nozzle 103 while rotating the wafer W, the etchant liquid L1 flows in the outward direction from the position of discharge due to centrifugal force, so that etching by the etchant liquid L1 proceeds further at the outer periphery at $P_{max}$, the portion at which the film is thickest. Accordingly, on the outside of the position $P_{max}$, diluting liquid L2 is discharged while moving the diluting liquid-discharging nozzle 105 in the radial direction of the wafer W, similarly to the above first example. Consequently, the rate of dilution of the etchant liquid L1 rises in moving to the outer periphery beyond the position $P_{max}$, and the effect of etching by the etchant liquid L1 is reduced.

Figure 8B:
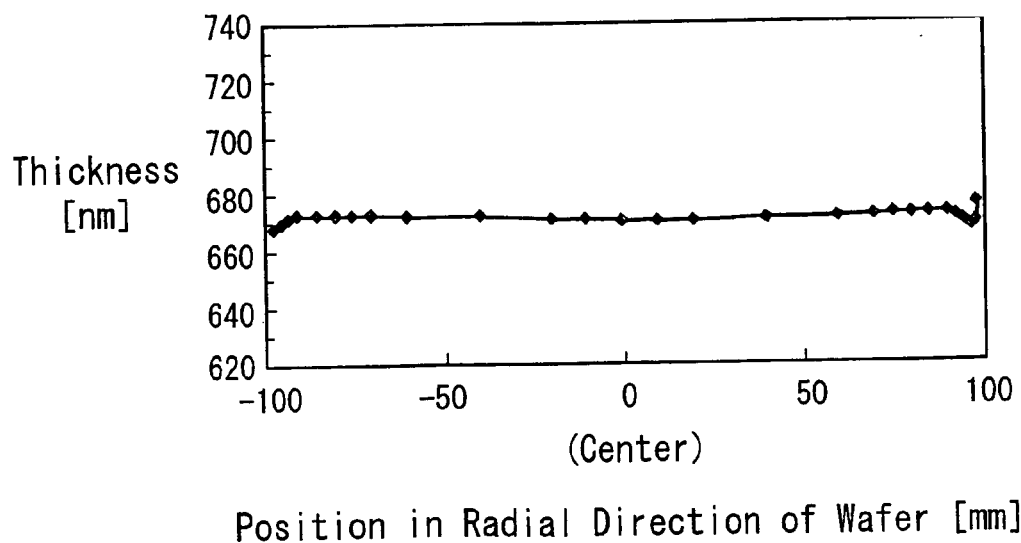

From the above, as shown by the film thickness profile of FIG. 8B, the difference in film thickness of the film for processing on the outside and the inside of the wafer W can be alleviated. Also, global differences over the surface of the film for processing can be alleviated. When a film for processing, the film thickness of which has been rendered uniform in this way, is subjected to CMP, etch-back or other planarizing processing, planarizing processing can be uniformly performed over the entire surface of the wafer 1.

Figure 9A:
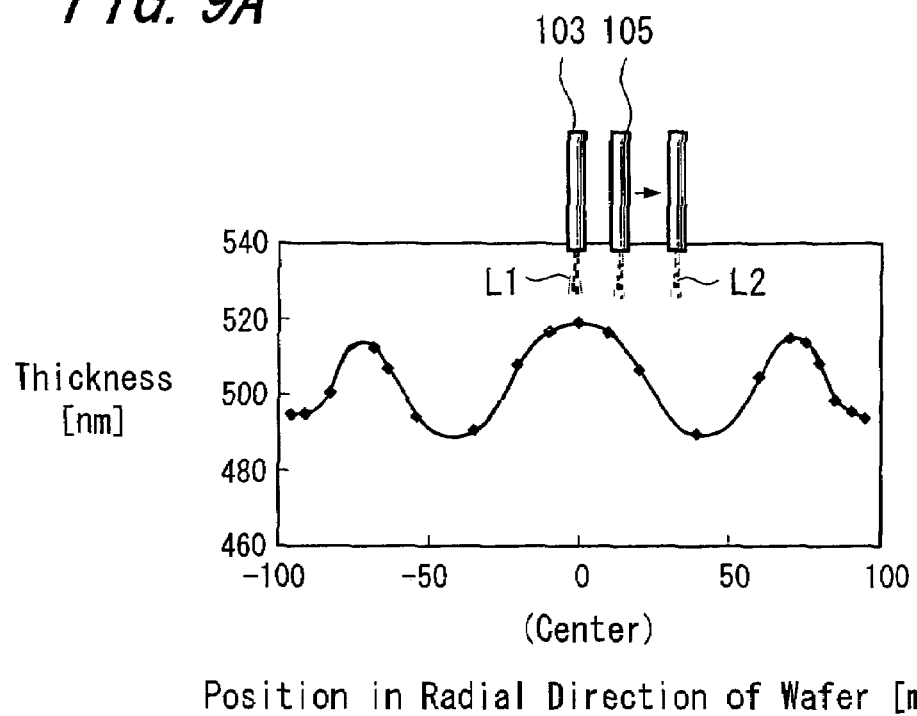
FIGS. 9A and 9B are film thickness profiles of a film for processing, showing a third example of an etching method of this invention.

Next, as a third example of an etching method, a case is illustrated in which a film for processing is formed on a wafer 1, when the film thickness profile has two peaks, at the center (0) in the radial direction and at the outer periphery in the radial direction, as shown in FIG. 9A. The dispersion in the film thickness of such a film for processing occurs similarly to that explained in the first example. Treatment of a film for processing with such a film thickness profile is performed as follows, combining the method of the first example and the method of the second example, explained above.

First, similarly to the first example explained using FIG. 7A, the wafer 1 is held and rotated with the center of the wafer 1 coinciding with the rotation center of the spin chuck 101. By discharging etchant liquid L1 from a liquid-discharging nozzle 103 at the center (0) of the wafer 1, which is the thickest portion of the film for processing, the film for processing on the wafer 1 is etched. Simultaneously with this, diluting liquid L2 is discharged while moving the diluting liquid-discharging nozzle 105 in the radial direction of the wafer 1, on the outside from the position where the etchant liquid L1 is discharged. At this time, the range of movement of the diluting liquid-discharging nozzle 105 may extend to the position of the thinnest portion between the two film thickness peaks, or movement may be to the outermost periphery.

Figure 9B:
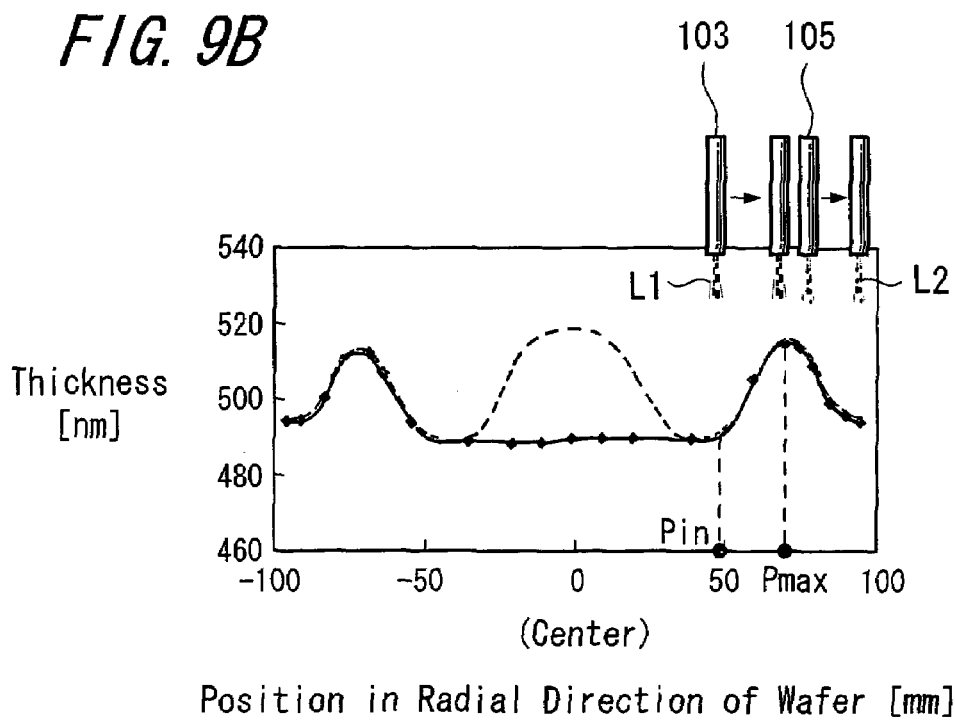

As a result, the central peak is planarized by etching, as shown in FIG. 9B. This is achieved by action similar to that explained in the first example. However, in this state the etchant liquid 1 is diluted by the diluting liquid L2, and the outer peak on the wafer as supplied remains unchanged.

Hence in such a state, by performing treatment similar to that of the second example explained using FIGS. 8A and 8B, the peak on the outside in the radial direction of the wafer (the thicker film portion) can be planarized by etching.

In the above third example, a procedure was explained in which, after planarizing the peak at the center by the method of the first example, the method of the second example is used to planarize the peak at the outer periphery. However, this procedure may be reversed to perform similar planarizing. In addition, if the etching device includes two sets of a liquid-discharging nozzle and a diluting liquid-discharging nozzle, the method of the first example and the method of the second example can be performed simultaneously, to accomplish similar planarizing. In this case, the two sets of a liquid-discharging nozzle and diluting liquid-discharging nozzle are positioned in the order, from the center of the spin chuck to the outer periphery, of liquid-discharging nozzle, diluting liquid-discharging nozzle, liquid-discharging nozzle, diluting liquid-discharging nozzle.

As explained in the above first through third examples, by means of an etching method of this invention, the film thickness can be rendered uniform regardless of the film thickness profile.

Also, in the etching methods explained in the above first through third examples, it is preferable that a kind of chemical capable of etching a film for processing in a lower rate be used as the etchant liquid L1, enabling the amount of etching to be controlled easily and the thickness of a film being reliably uniform.

Further, in the above etching methods it is preferable that the discharge amounts and discharge times of the liquids L1 and L2, as well as the wafer rotation rate, be set such that the etchant liquid L1 and diluting etchant liquid L2 do not flow from the respective discharge positions to the center position. By this means, the etching rate (etching effect) in the wafer radial direction can be controlled more reliably.

In the above etching methods, the temperature of the etchant liquid L1 may be made high (30° C. or higher, and preferably 40° C. to 60° C.), such that the etching amount is suppressed through the cooling effect when the etchant liquid L1 flows to the wafer periphery. The etching rate is higher for higher temperatures of the etchant liquid L1. Hence when high-temperature etchant liquid L1 is discharged from the liquid-discharging nozzle 103, the etching rate is high in the vicinity of the discharge position, but as the etchant liquid L1 flows to the outer periphery the temperature of the etchant liquid L1 falls, and the etching rate also falls. Hence together with the decline in etching rate due to dilution of the etchant liquid L1 through the supply of diluting liquid L2, the etching rate can also be lowered through the reduced temperature, so that excessive etching at peripheral positions of the wafer 1 is prevented.

When adopting such a method, in order to promote cooling of the etchant liquid L1, it is more effective to provide the spin chuck 101 with a function for lowering the temperature of the peripheral portion of the wafer 1. As a mechanism to provide such a function to lower the temperature, for example, a coolant such as $N_2$ or similar can be discharged only onto the rear surface of the peripheral portion of the wafer 1 to cause cooling, or other means can be used.

As another method to reduce the effect of etching by the etchant L1 on the outside compared with the position where the etchant liquid L1 is discharged, a method may be employed in which the flow rate of the etchant liquid L1 toward the outer periphery is increased by spraying an inert gas G1 from a gas supply nozzle 107 on the outer side of the position where the etchant liquid L1 is discharged. In this case, the inert gas G1 is sprayed from obliquely above the wafer 1 toward the outer periphery of the wafer 1 on the outer side of the position of discharge of the etchant liquid L1. In this way, by increasing the speed of flow of the etchant liquid L1, the time of supplying the etchant liquid L1 is shortened at the outer periphery compared with the position of discharge of the etchant liquid L1. As a result, using this method also, the etching rate (etching effect) can be reduced at the outer periphery compared with the position where the etchant liquid L1 is discharged.

When performing etching accompanied by such spraying of an inert gas, the gas supply nozzle 107 to spray the inert gas G1 toward the outer periphery of the wafer 1 is provided in the etching device explained using FIG. 6, on the outside of the position where the etchant liquid L1 is discharged by the liquid-discharging nozzle 103 in the radial direction of the wafer 1.

Embodiment 1

Here, an embodiment in which an etching method of this invention is applied to an STI process in semiconductor device manufacturing is explained.

Figure 10A:
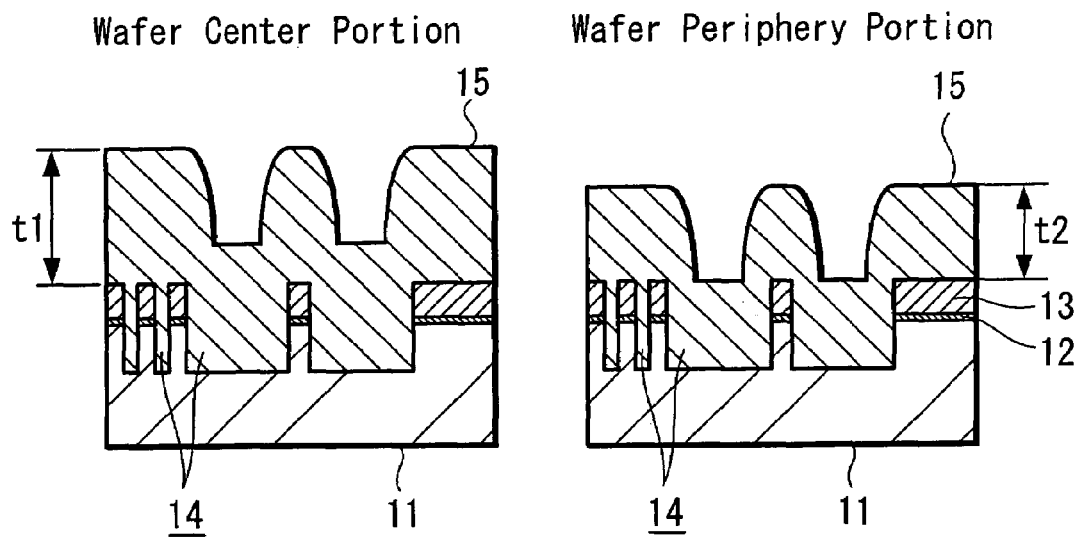
FIGS. 10A to 10C are cross-sectional process diagrams to explain Embodiment 1.

The sample used in this example has the structure shown in FIG. 10A; a thermal oxide film 12 of thickness approximately 5 nm to 20 nm and a silicon nitride film serving as a CMP stopper layer 13 and of thickness approximately 50 nm to 250 nm are formed by reduced-pressure CVD on a silicon substrate 11 in the form of a wafer, after which a KrF excimer stepper is used to pattern photoresist and trenches 14 of depth 450 nm are formed, and then CVD is used to deposit a silicon oxide film to serve as a buried insulating film 15.

The profile prior to etching previously shown in FIG. 7A was the result of measurement of the thickness of the buried insulating film 15 on the stopper layer 13 in the radial direction of the silicon substrate 11. As is clear from the figure, the buried insulating film 15 has a large film thickness difference between the center (0) portion of the silicon substrate and the peripheral portion thereof, with the film thickness greater at the center (0) portion and then gradually decreasing in moving toward the outer periphery.

With a buried insulating film 15 having such a film thickness profile as the film for processing, etching was performed so as to eliminate the excess thickness in the center portion. 1) As an etchant liquid enabling wet etching of the buried insulating film 15 which is the film for processing, diluted hydrofluoric acid (DHF) was adopted. 2) As the diluting liquid to dilute the etchant liquid, water was adopted. 3) The center of the silicon substrate 11 serving as the wafer was set as the rotation center, and the liquid-discharging nozzle 103 was fixed such that the position where the etchant liquid L1 was discharged was this center. 4) The diluting liquid-discharging nozzle 105 was moved from a position 20 mm in the outward direction from the center (0) of the silicon substrate 11 to a position 50 mm distant in 5 mm intervals, and the diluting liquid L2 was discharged, with the discharge flow rate at the low flow rate of 1 liter/minute or less, at each position for three seconds.

Figure 10B:
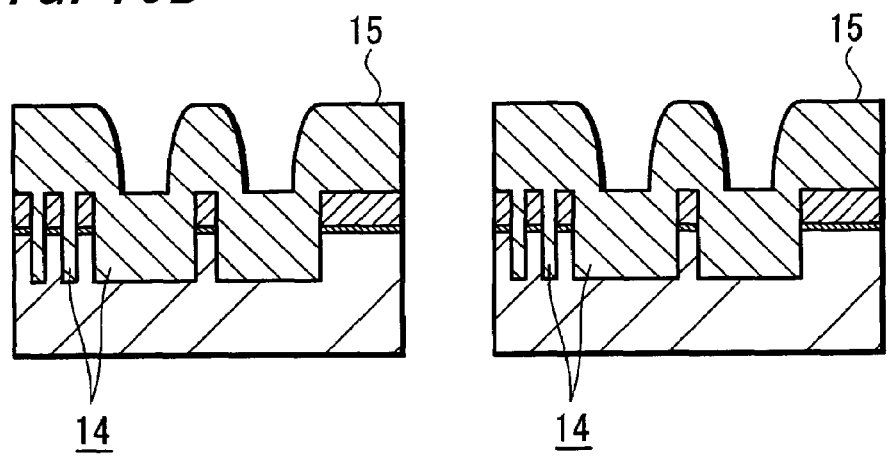

Upon measuring the thickness of the buried insulating film 15 on the stopper layer 13 in the radial direction of the silicon substrate 11 after performing the above etching, the film thickness was reduced in the center portion and the film was finished to approximately the same thickness from the center to the outer periphery, as shown by the profile after etching of FIG. 7B. And, as shown in FIG. 10B, global differences in the thickness of the buried insulating film 15 on the silicon substrate 11 were alleviated.

Figure 10C:
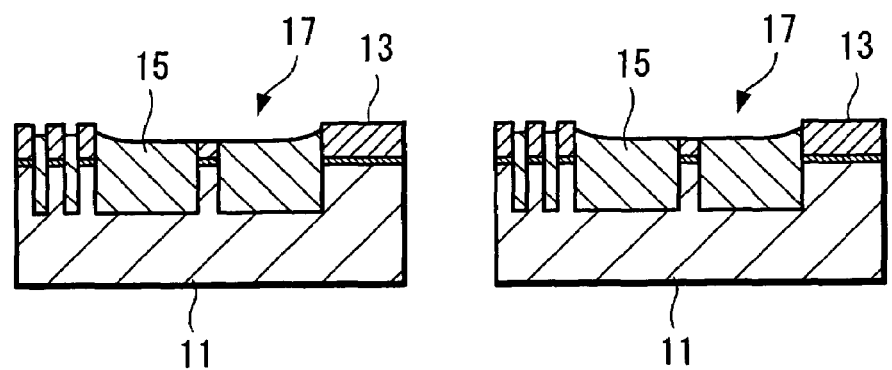

From this state, CMP was used to polish and remove the entirety of the buried insulating film 15 on the stopper layer 13, as shown in FIG. 10C. At this time, because there is no global difference in thickness between the center and the outer periphery of the silicon substrate 11, STI 17 could be formed with the same shape over the entirety of the silicon substrate 11.

Embodiment 2

Figure 11A:
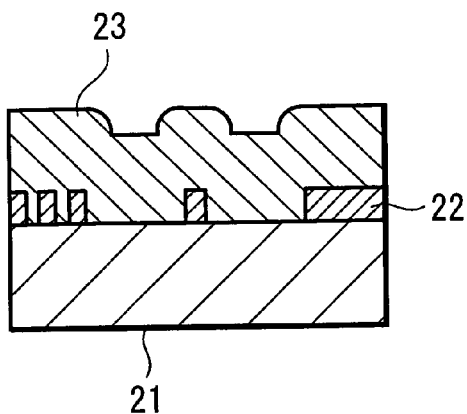
FIGS. 11A to 11C are cross-sectional process diagrams to explain Embodiment 2.
Figure 11A:
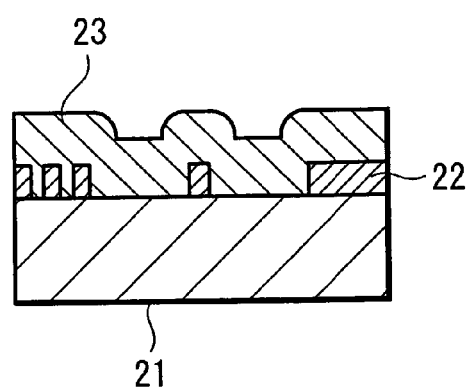

The sample used in this example has the structure shown in FIG. 11A. In this sample, the silicon substrate 21 in which elements are fabricated is in wafer form, on which a metal wiring film is formed via an oxide film not shown; and further is patterned using lithographic techniques and reactive ion etching (RIE) to form the metal wiring 22. Thereafter an inter-layer insulating film 23 is formed by plasma CVD between wiring layer portions so as to bury the metal wiring 22.

The profile before etching previously shown in FIG. 7A is the measured film thickness of this inter-layer insulating film 23 in the radial direction of the silicon substrate 21. As is clear from the figure, there is a large difference in the thickness of this inter-layer insulating film 23 between the center (0) portion of the silicon substrate 21 and the outer periphery, with the film thickness large at the center (0) portion but decreasing gradually toward the outer periphery.

With an inter-layer insulating film 23 having such a film thickness profile as the film for processing, etching similar to that of Embodiment 1 described above was performed so as to eliminate the excess thickness in the center portion.

Figure 11B:
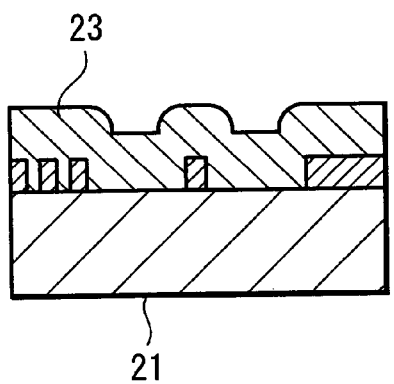
Figure 11B:
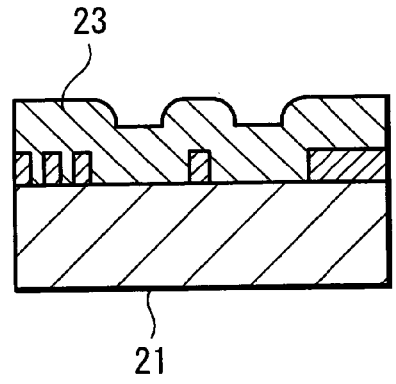

The shape of the inter-layer insulating film 23 after performing this etching is as shown in FIG. 11B; the film thickness in the center portion was reduced, and the film was finished to approximately the same thickness from the center to the outer periphery. Hence, global differences in the surface of the inter-layer insulating film 23 on the silicon substrate 21 were alleviated.

Figure 11C:
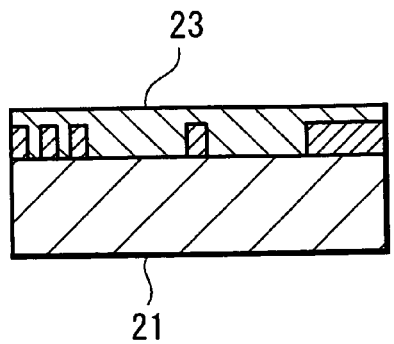
Figure 11C:
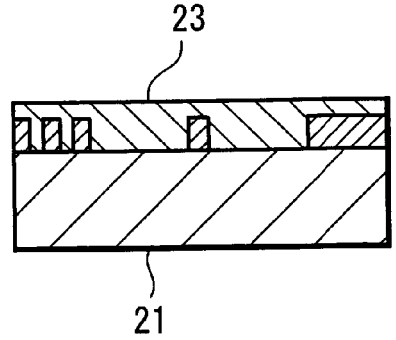

The result of etch-back treatment by RIE, CMP polishing or other planarizing of the inter-layer insulating film 23 following this appears in FIG. 11C. As is clear from the figure, differences in the shape at the center and periphery of the silicon substrate 21 are eliminated, and a wiring inter-layer structure with the same shape was obtained across the entire plane of the silicon substrate 21.

In the above-described Embodiments 1 and 2, examples were disclosed in which a film for processing formed on a wafer (silicon substrate), such as a buried insulating film or an inter-layer insulating film, was subjected to treatment to modify the shape of the film for processing prior to processing; however, the film for processing may be the wafer itself, and a method of this invention may be used to perform planarizing in the case where, for example, the wafer thickness differs at the wafer center and periphery.

In the above, cases of performing etching based on a film thickness profile were explained. However, etching methods of this invention may be employed to perform etching based on a topmost-surface height position profile on a wafer, which is a global difference in the wafer surface and is not local differences due to formation of trenches, wiring or similar. In this case, the above mentions of thicker film portions and similar should be replaced by terms referencing portions at higher surface positions.

As explained above, in an etching method of this invention, by diluting etchant liquid, discharged onto a thick portion of a film for processing which has spread to a thin portion of the film for processing, with a diluting liquid discharged onto the thin portion of the film, the effect of etching of the film for processing by the etchant liquid is weakened at the thin portion of the film, and the etching rate at film portions thicker than the thin portion can be increased. Consequently the film thickness can be rendered uniform regardless of the film thickness profile of the film for processing, and consequently global planarizing of the wafer surface becomes possible.

In an etching device of this invention, by providing a liquid-discharging nozzle which discharges etchant liquid at a predetermined position in the radial direction of a wafer held and rotated on a spin chuck and a diluting liquid-discharging nozzle which discharges diluting liquid on the outside of the above predetermined position, the etchant liquid flowing outward from the position of discharge of etchant liquid due to centrifugal force is diluted and the etching effect thereof diminished, and in addition the inflow of etchant liquid on the inside of the position of discharge of etchant liquid is prevented so that etching can be suppressed. Hence etching can be performed in which the etching effect is greatest at the position of discharge of the etchant liquid, and the etching effect is suppressed on the outside and inside of the above position.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. An etching method in which the film thickness profile of a film for processing formed on a wafer is ascertained in advance and wet etching is performed by discharging etchant liquid at a thick portion of said film for processing, wherein:

simultaneously with the discharge of said etchant liquid, a diluting liquid for the etchant liquid is discharged at a thin portion of said film for processing; and inert gas is sprayed, on the outer side of the position where said etchant liquid is discharged, at the periphery portion of the wafer so as to increase the fluid speed of the etchant liquid.

2. The etching method according to claim 1, wherein the film thickness profile of said film for processing in the radial direction of said wafer is ascertained in advance, and while rotating the wafer the etchant liquid is discharged at a thick portion of the film for processing in the radial direction of the wafer, while in addition discharging the diluting liquid for the etchant liquid on the outer side of the position where the etchant liquid is discharged.

3. The etching method according to claim 2, wherein diluting liquid for said etchant liquid is discharged at a plurality of positions in the radial direction of said wafer.

4. The etching method according to claim 2, wherein said etchant liquid is discharged at a plurality of positions on the inner side of the position where the diluting liquid is discharged.

\* \* \* \* \*